United States Patent [19]

Heckman, Jr.

[11] 3,845,403

[45] Oct. 29, 1974

[54] AMPLIFIER FOR AMPLITUDE MODULATED WAVES WITH MEANS FOR IMPROVING SIDEBAND RESPONSE

[75] Inventor: LeRoy Francis Heckman, Jr., New Holland, Pa.

[73] Assignee: RCA Corporation, New York, N.Y.

[22] Filed: Dec. 27, 1972

[21] Appl. No.: 319,007

[52] U.S. Cl. .................................... 330/31, 330/21

[51] Int. Cl. .............................................. H03f 3/04

[58] Field of Search ........................ 330/21, 31, 107; 333/70 CR

[56] References Cited

UNITED STATES PATENTS

| | | | |
|---|---|---|---|
| 3,383,611 | 5/1968 | Huffnagle et al. | 330/31 X |
| 3,454,895 | 7/1969 | Hall et al. | 330/31 |
| 3,461,394 | 8/1969 | Ulmer | 330/31 X |

*Primary Examiner*—Herman Karl Saalbach
*Assistant Examiner*—Lawrence J. Dahl
*Attorney, Agent, or Firm*—Edward J. Norton; Robert L. Troike

[57] ABSTRACT

An amplifier suitable for use as a driver amplifier in a television transmitter is described. An upper sideband peaking circuit is coupled across the input of the amplifier. The amplifier with the peaking circuit, in response to an amplitude modulated carrier wave, provides an amplified replica of the input wave with a uniform amplitude over a selected range of sideband frequencies.

6 Claims, 3 Drawing Figures

AMPLIFIER FOR AMPLITUDE MODULATED WAVES WITH MEANS FOR IMPROVING SIDEBAND RESPONSE

BACKGROUND OF THE INVENTION

This invention relates to amplifier circuits and more particularly to high frequency, relatively high power amplifiers such as those for amplifying UHF television frequency signals (470–890 MHz) to provide output power levels up to 10 watts.

In the prior art, this type of amplification in television transmitters has been done using vacuum tubes. The amplifier typically drives a four cavity klystron which in response to an input signal at 10 watts can produce an output power of 30,000 watts. An effort to increase the use of solid state design makes it desirable to transistorize this driver amplifier. It has been found that while a typical transistor amplifier circuit provides flat R.F. amplification over a desired UHF television carrier frequency band, the amplitude of the detected video output, which is required to be maintained substantially constant (±0.5 db) out beyond 4 MHz above the carrier, drops considerably beyond 0.5 MHz above the carrier and does not meet the required customer specifications (±0.5 db out to about 4.2 MHz beyond the carrier frequency).

BRIEF DESCRIPTION

Briefly, there is provided by this invention a radio frequency transistor amplifier suitable for use as a television transmitter driver-amplifier for amplifying modulated carrier waves having carrier frequency components and sideband frequency components. The amplifier includes a transistor having input, output and common electrodes with means coupled thereto for suitably biasing the transistor. The biasing means includes a degenerative resistor coupled between the input and common electrodes. Input and output impedance matching networks for the transistor are dimensioned and arranged to provide input and output coupling of signal energy over the operating frequency band. To prevent the amplifier from exhibiting at its output a drop in the amplitude of upper sideband components relative to the uniform amplitude thereof in the received amplitude modulated carrier wave, a peaking circuit is coupled across the input of the transistor and in response to the amplitude modulated carrier wave operates to increase the relative amplitude at those upper sideband frequencies in the output amplified wave to compensate for said drop.

DETAILED DESCRIPTION

A more detailed description of a preferred embodiment of the present invention follows in conjunction with the following drawings.

Figure 1:
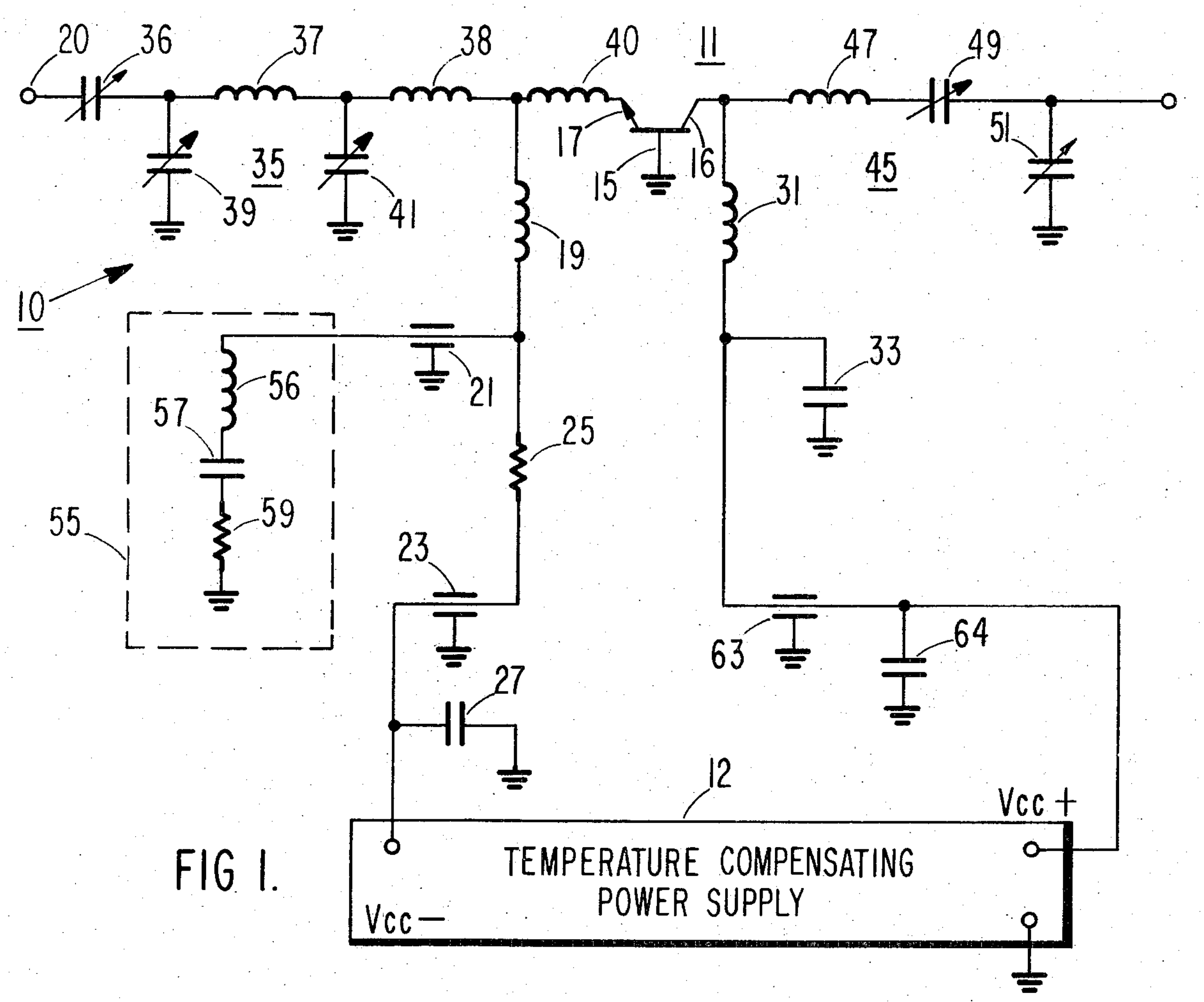
FIG. 1 is a schematic diagram of an amplifier according to the present invention.

Referring to the schematic of FIG. 1, there is illustrated a UHF television frequency amplifier 10, capable of amplifying UHF signals to provide output power levels up to 5 watts with 0.5 watt input. When two such amplifiers are connected using a hybrid (not shown), for example, 10 watt output power is achievable. The output of these amplifiers can be used to drive a four cavity UHF klystron which can produce with 10 watts input an output power of 30,000 watts. The UHF television frequency bands extend from 470 to 890 MHz. The circuit 10 includes a transistor 11. The particular transistor device used is, for example an RCA 2N6266 supplied by RCA Corporation, Somerville, N. J. This transistor is normally used at frequencies in the higher 2 GHz region. This transistor however includes emitter ballasting which permits it to operate at lower frequencies. This transistor is suitable since no relatively high power transistors are available at the above mentioned UHF frequencies.

The transistor 11 is biased using a temperature compensating power supply 12. The negative terminal (Vcc−) of this power supply is coupled via resistor 25 and inductors 19 and 40 to the emitter 17 of transistor 11. Capacitors 21 and 23 are UHF television frequency bypass capacitors to bypass the signals at the UHF carrier frequencies from the power supply. Capacitor 27 bypasses any of the television video frequencies from the power supply 12. The positive terminal (Vcc+) of supply 12 is coupled via RF choke coil 31 to collector 16 of transistor 11. The base terminal 15 of transistor 11 is coupled to a point at ground potential. Capacitors 33 and 63 bypass signals at the UHF carrier frequencies from the power supply 12. Capacitor 64 bypasses any of the lower television video frequencies from the power supply 12. The biasing level of this transistor 11 is adjusted, for example, so that with resistor 25 the device is operated in the linear region (transistor 11 is operated, for example, to no more than one half capable output power) and class A. The value of resistor 25 is made large enough to prevent secondary voltage breakdown of the collector base junction of transistor 11 at the maximum R.F. power output level. The value of resistor 25 is made small enough to accommodate constant and relatively high gain. The resistor 25 provides a sliding bias which extends the linear operating range of the transistor by changing the class of operation from Class A at low input R.F. (UHF frequency) power levels to class C at high input R.F. (UHF frequency) power levels. In the instant case for producing between 0.024 and 5 watts power output, the input power would be between 0.002 and 0.5 watts. The low input power level (class A operation) would therefore be near the 0.002 watt level and the high input power level (class C operation) would be near the 0.5 watt level. The temperature compensating power supply 12 includes means for sensing the temperature at the transistor 11 and for changing the bias level to the transistor with changes in temperature from a selected normal temperature to achieve operating characteristics which are independent of temperature.

Coupled across the base-emitter circuit of transistor 11 is an input impedance matching network 35 comprising a variable series coupling capacitor 36 and a pi-network of a series inductor 37 and parallel capacitors 39 and 41 and a pair of series inductors 38 and 40. Coupled across the collector-base of transistor 11 is an output impedance network 45 comprising inductor 47, and capacitors 49 and 51. The input and output capacitors and inductors are adjusted to provide input and output impedance matching with essentially a linear gain over the desired operating UHF television frequency band (524 to 530 MHz for example).

Figure 2:
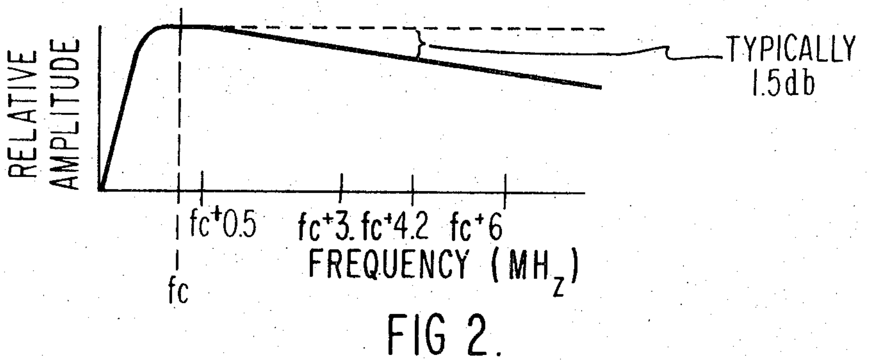
FIG. 2 is a plot of frequency vs. amplitude for an amplifier arrangement as shown in FIG. 1 without a peaking circuit.

It has been found that although unmodulated carrier frequency waves within the 524 to 530 MHz frequency band are coupled out of this circuit with substantially uniform amplification over this selected UHF television frequency band, the same is not true of an amplitude modulated wave having carrier and sideband components over the same 524 to 530 MHz frequency band. When an amplitude modulated wave having equal amplitude sideband components is coupled to the above described amplifier, the output amplitude of these sideband frequencies begins to drop at sideband frequencies about 0.5 MHz above the carrier frequency ($f_c$) with the typical output amplitude of these sideband frequencies down 1.5 db at +4.2 MHz above the carrier frequency ($f_c$). See FIG. 2. The Federal Communication Commission (FCC) requirement for television performance requires that this gain be substantially uniform over the band out to +4.2 MHz above the carrier frequency ($f_c$).

Figure 3:
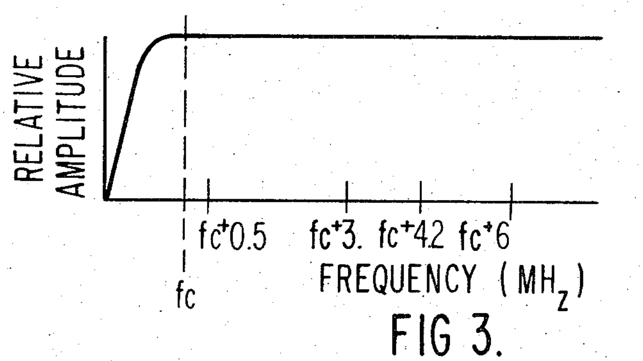
FIG. 3 is a plot of the desired and achieved frequency vs. amplitude characteristics for an arrangement as shown in FIG. 1 with a peaking circuit according to the present invention.

In accordance with the present invention a sideband peaking circuit 55 is coupled between ground and emitter 17 via the inductance coil 19 and capacitor 21. This peaking circuit 55 operates at about the video or intelligence frequencies (about 0.5 MHz up to 4.2 MHz) to provide the flat sideband frequency response out beyond the 4.2 MHz above the carrier frequency as shown in FIG. 3. All UHF frequency signals are decoupled from this sideband peaking circuit due to feedthrough bypass capacitors 21 and 23. Those signals below about 25 MHz are applied to the peaking circuit 55. The peaking circuit 55 includes an inductance 56, a capacitance 57 and a resistance 59. The value of capacitor 57 for an inductance 56 provided by a 3½ inch No. 20 wire and a resistance 59 of 3 ohms is between 1000 and 4000 pf. By increasing the capacitance, the peaking occurs at a lower frequency and by increasing the resistance valve the amplitude is flattened and a more broad band peaking occurs.

The desired response shown in FIG. 3 was achieved when operating over the 524 to 530 MHz band (channel 23) with the amplifier circuit 11 having the following values and dimensions:

Capacitors 36, 39, 41 and 51 — 0.8–10 pf. (picofarads) variable. Capacitor 49 — 1–20 pf. variable. At 524–530 MHz these capacitors were set at about 4 pf. for capacitor 36, 2 pf. for capacitor 39, 10 pf. for capacitor 41, 3 pf. for capacitor 51, and 7 pf. for capacitor 49.

Capacitor 21 — 1000 pf.

Capacitor 23 — 1500 pf.

Capacitor 27 — 600 microfarads, 3 volts

Capacitor 57 — 1000 pf. - 4000 pf. disc ceramic

Capacitor 33 — 0.1 mf. disc ceramic

Capacitor 63 — 1500 pf.

Capacitor 64 — 100 microfarad, 50 volts

Inductance 37 formed by a strap of copper 200 mils long by 100 mils wide.

Inductance 38 formed by a strap of copper 250 mils wide and 350 mils long.

Inductance 47 formed by a strap of copper 500 mils long and 200 mils wide plus one coiled turn of No. 18 wire of 300 mils internal diameter.

Inductance 19 — 900 mils long No. 18 wire plus three coiled turns of 100 mils internal diameter.

Inductance 56 — 3½ inches of No. 20 wire from feedthrough capacitor 21 to ground.

Inductance 31 — 2.5 inch long of No. 18 wire straight.

Inductance 40 — formed by a strap of copper 250 mils by 250 mils.

Resistor 59 — 2 to 7 ohms.

In the above arrangement the negative bias voltage (Vcc−) was 0.75 volts and the positive bias voltage (Vcc+) was 27.25 volts. Under the above conditions the amplifier signal normal operating R.F. output power range would be from 0.024 watts to 5.0 watts with 0.0024 to 0.5 watt input power.

In a typical procedure for selecting the correct capacitor 57 value and resistor 59 value, an effective amplitude modulated wave having carrier frequency components and substantially uniform 20 percent modulation level sideband frequency components is provided at the amplifier input by a suitable signal source such as a signal generator amplitude modulated by video frequencies. The amplified amplitude modulated wave is detected by a sideband analyzer and the detected signal is displayed by an oscilloscope, with the detected carrier frequency ($f_c$) displayed toward the left and the upper sideband frequency components displayed to the right of the detected carrier frequency ($f_c$). With a power output level of about 0.6 watts, the resistor and capacitor values are selected with the values stated previously to achieve the desired upper sideband fidelity (flat) response.

What is claimed is:

1. In an amplifier suitable for use in a television transmitter for amplifying amplitude modulated waves including a carrier frequency component and sideband frequency components over a desired carrier frequency band wherein said amplifier comprises:

a transistor device having input, output and common electrodes, means including a resistor degeneratively coupled between said input and common electrode for forward biasing said transistor, an input matching network coupled between said input and common electrodes for providing transfer of signal energy at the carrier and sideband frequencies to said transistor, an output matching network coupled between said output and common electrodes for providing transfer of signal energy at said carrier and sideband frequencies out of said transistor, said amplifier characterized by an output which, in response to unmodulated waves over said desired carrier frequency band, exhibits a given amplification over the band and in response to an amplitude-modulated wave having a carrier frequency component and sideband frequency components of substantially uniform amplitude received by said amplifier, exhibits a decrease in amplification relative to said given amplification at the upper sidebands above about 0.5 MHz from said carrier with said amplification decreasing with increasing frequency, the improvement therewith of a sideband peaking means coupled between said input and common electrodes and including a peaking circuit resonant at a frequency significantly lower than any of the frequencies within said desired carrier frequency band and a decoupling means coupled at one end between said peaking circuit and said input electrode and at the opposite end to a point of reference potential for rendering signal peaking circuit responsive only to signals at frequencies significantly lower than frequencies within said desired carrier frequency band, said peaking circuit responsive only to said signals at frequencies significantly lower than frequencies within said desired carrier frequency band and occurring during the reception of said received amplitude-modulated wave to increase the relative amplitudes of said upper sidebands at said amplifier output to at least compensate for said decrease in amplification at said upper sidebands.

2. The combination claimed in claim 1 wherein said common electrode is at ground potential.

3. The combination claimed in claim 1 wherein said peaking circuit includes a resistor, capacitor and inductance network responsive only to signals at frequencies below 25 MHz.

4. The combination claimed in claim 3 wherein said amplitude modulated waves are vestigial sideband waves as used in UHF television transmission.

5. The combination claimed in claim 4 wherein the value of said resistor degeneratively coupled is selected to bias the amplifier to operate at class A at relatively low input power levels and class C at relatively high input power levels.

6. The combination claimed in claim 1 wherein said peaking circuit is arranged to uniformitize the relative amplitude of the upper sideband frequencies.

* * * * *